United States Patent
Chen et al.

(10) Patent No.: US 9,402,329 B1
(45) Date of Patent: Jul. 26, 2016

(54) CABLE MANAGEMENT ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Lu Chu District, Kaohsiung (TW); KING SLIDE TECHNOLOGY CO., LTD., Kaohsiung Science Park, Lu Zhu Dist., Kaohsiung (TW)

( * ) Notice: Subject to any disclaimer, the term of this patent is extended or adjusted under 35 U.S.C. 154(b) by 0 days.

(21) Appl. No.: 14/813,101

(22) Filed: Jul. 29, 2015

(30) Foreign Application Priority Data

May 5, 2015 (TW) .............................. 104114360 A

(51) Int. Cl.
*H02G 3/04* (2006.01)
*H05K 7/14* (2006.01)
*F16L 3/08* (2006.01)

(52) U.S. Cl.
CPC ................ *H05K 7/1491* (2013.01); *F16L 3/08* (2013.01)

(58) Field of Classification Search
CPC . H05K 7/1491; H02G 3/0456; H02G 3/0418; H02G 3/26; F16L 3/08
USPC ............ 248/73, 65; 174/68.1, 68.3, 72 C, 95; 361/826, 752, 730
See application file for complete search history.

(56) References Cited

U.S. PATENT DOCUMENTS

| 5,921,402 | A | * | 7/1999 | Magenheimer | H02G 3/26 211/26 |
| 6,215,069 | B1 | * | 4/2001 | Martin | H02G 3/0456 174/68.3 |
| 6,646,893 | B1 | | 11/2003 | Hardt | |
| 7,554,819 | B2 | * | 6/2009 | Chen | H05K 7/1491 361/727 |
| 8,634,198 | B2 | * | 1/2014 | Chen | H05K 7/1491 174/68.3 |
| 9,072,190 | B2 | * | 6/2015 | Chen | H05K 7/1421 |
| 2006/0113433 | A1 | * | 6/2006 | Chen | H05K 7/1491 248/70 |
| 2012/0145837 | A1 | | 6/2012 | Li | |

FOREIGN PATENT DOCUMENTS

EP   2 608 646 A1   6/2013

* cited by examiner

*Primary Examiner* — Todd M Epps
(74) *Attorney, Agent, or Firm* — Winston Hsu; Scott Margo

(57) ABSTRACT

A cable management assembly includes a cable management arm and a cable management device. The cable management arm is arranged with a mounting hole and a positioning hole. The mounting hole includes a first hole portion and a second hole portion. The cable management device is detachably mounted to the cable management arm and includes a mounting portion and an elastic portion. Wherein the mounting portion of the cable management device is capable of entering the second hole portion from the first hole portion of the mounting hole, and the mounting portion is blocked by a blocking section adjacent to the second hole portion. The elastic portion of the cable management device is configured to enter the positioning hole to be blocked by at least one blocking wall of the cable management arm.

10 Claims, 8 Drawing Sheets

CABLE MANAGEMENT ASSEMBLY

BACKGROUND OF THE INVENTION

1. Field of the Invention

The present invention relates to a cable management assembly, and more particularly, to a cable management assembly capable of being utilized in a rack system for organizing cables of a carried object.

2. Description of the Prior Art

A rack system is usually arranged with a cable management assembly. For example, U.S. Pat. No. 7,554,819 B2 discloses a cable management assembly. The cable management assembly comprises two cable management arms (11, 12) movably connected to each other, and the two cable management arms (11, 12) are arranged with a plurality of cable holders (15). The cable holders (15) can be utilized to organize cables behind a carried object (such as an electronic device) in a rack system. The case is provided for reference.

SUMMARY OF THE INVENTION

The present invention relates to a cable management assembly. The cable management assembly comprises a cable management device capable of being rapidly mounted to or detached from a cable management arm.

According to an embodiment of the present invention, a cable management assembly comprises a cable management arm and a cable management device. The cable management arm is arranged with a first mounting hole and a positioning hole. The first mounting hole comprises a first hole portion and a second hole portion. The cable management device is detachably mounted to the cable management arm. The cable management device comprises a base, a first mounting portion and an elastic portion. The first mounting portion is connected to the base, and comprises a first protruding section and a second protruding section substantially connected to the first protruding section perpendicularly. The elastic portion is arranged on the base. Wherein, the first protruding section of the first mounting portion of the cable management device is capable of entering the second hole portion from the first hole portion of the first mounting hole of the cable management arm, and the second protruding section of the first mounting portion is blocked by a blocking section adjacent to the second hole portion. The elastic portion of the cable management device is configured to enter the positioning hole to be blocked by at least one blocking wall of the cable management arm.

According to another embodiment of the present invention, a cable management assembly comprises a cable management arm and a cable management device. The cable management arm comprises an arm portion, and the arm portion is arranged with a first mounting hole and a positioning hole. The first mounting hole comprises a first hole portion and a second hole portion smaller than the first hole portion. The cable management device is detachably mounted to the cable management arm. The cable management device comprises a base, a first mounting portion and an elastic portion. The first mounting portion is connected to the base, and comprises a first protruding section and a second protruding section connected to the first protruding section. The elastic portion is arranged on the base. Wherein, when the first protruding section of the first mounting portion of the cable management device starts to enter the second hole portion from the first hole portion of the first mounting hole of the cable management arm, the elastic portion of the cable management device accumulates an elastic force; and when the second protruding section of the first mounting portion is blocked by a blocking section adjacent to the second hole portion, the elastic portion of the cable management device enters the positioning hole and release the elastic force, and the elastic portion is blocked by at least one blocking wall of the arm portion of the cable management arm. In addition, when the elastic portion is operated to avoid being blocked by the at least one blocking wall of the arm portion of the cable management arm, the second protruding section of the first mounting portion of the cable management device is capable of moving apart from the blocking section.

According to another embodiment of the present invention, a cable management assembly is applicable to a carried object, and the carried object is arranged on a pair of posts of a rack through a slide rail assembly. The slide rail assembly comprises a first rail and a second rail longitudinally movable relative to the first rail. The carried object is configured to mount on the second rail. The cable management assembly comprises a first cable management arm, a second cable management arm and a cable management device. The first cable management arm is connected to the first rail of the slide rail assembly through a connection component. A first end of the second cable management arm is movably connected to the first cable management arm (such as pivoted to the first cable management arm through a connection part), and a second end of the second cable management arm is connected to one of the second rail and the carried object through another connection component. One of the first cable management arm and the second cable management arm comprises an arm portion. The arm portion is arranged with a first mounting hole and a positioning hole, and the first mounting hole comprises a first hole portion and a second hole portion smaller than the first hole portion. The cable management device is detachably mounted to the arm portion. The cable management device comprises a base, a first mounting portion and an elastic portion. The first mounting portion is connected to the base, and comprises a first protruding section and a second protruding section substantially connected to the first protruding section perpendicularly. The elastic portion is arranged on the base. Wherein, the first protruding section of the first mounting portion of the cable management device is capable of entering the second hole portion from the first hole portion of the first mounting hole, and the second protruding section of the first mounting portion is blocked by a blocking section adjacent to the second hole portion. The elastic portion of the cable management device is configured to enter the positioning hole to be blocked by at least one blocking wall of the arm portion.

According to one of the above embodiments of the present invention, the cable management arm further comprises a second mounting hole. The first mounting hole and the second mounting hole are arranged at two corresponding positions on the cable management arm, and the second mounting hole comprises a first hole portion and a second hole portion. The cable management device further comprises a second mounting portion. The second mounting portion is connected to the base and comprises a first protruding section and a second protruding section substantially connected to the first protruding section perpendicularly. The first protruding section of the second mounting portion is capable of entering the second hole portion from the first hole portion of the second mounting hole, and the second protruding section of the second mounting portion is blocked by a second blocking section.

According to one of the above embodiments of the present invention, the elastic portion of the cable management device comprises a first section and a second section corresponding to the first section. The first section is connected to the base, and a clasp arm is arranged on the first section for clasping with the first cable management arm. The second section of the elastic portion corresponds to a space defined on the base of the cable management device.

One of the characteristics of the present invention is that the cable management device is capable of being rapidly mounted to or detached from a cable management arm.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
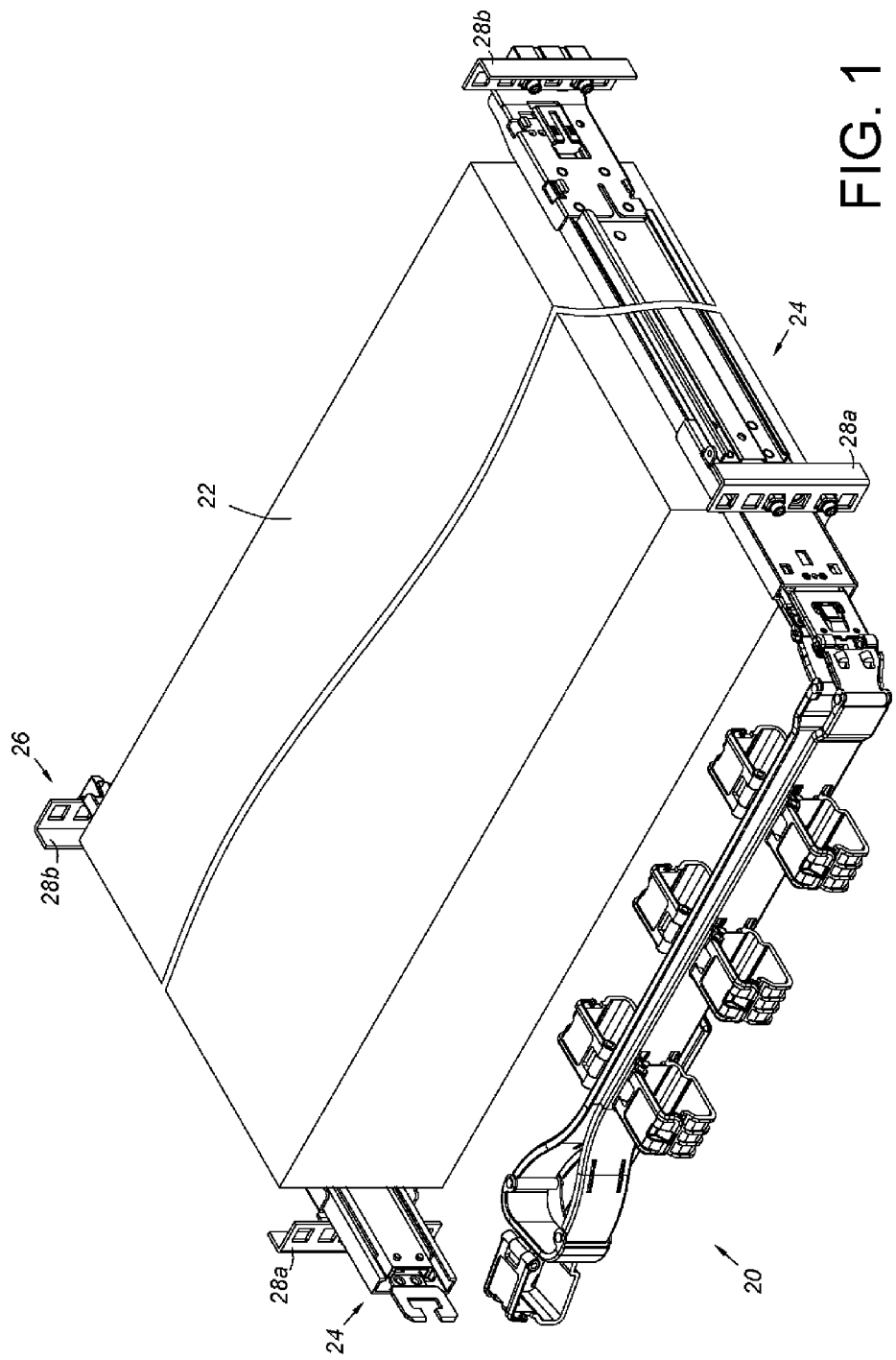
FIG. 1 is a diagram showing a cable management assembly utilized in a rack system for a carried object according to an embodiment of the present invention.

FIG. 1 shows a cable management assembly 20 utilized in a rack system according to an embodiment of the present invention. The rack system comprises a carried object 22, and both sides of the carried object 22 can be arranged on two pairs of posts of a rack 26 through a pair of slide rail assemblies 24. Specifically, the carried object 22 can be an electronic device, and each side of the carried object 22 can be arranged on one pair of posts 28a, 28b of the rack 26 through the slide rail assembly 24. On the other hand, the cable management assembly 20 can be used to organize cables (not shown) behind the carried object 22. Since the above arrangement is well known to those skilled in the art, further explanation is not provided.

Figure 2:
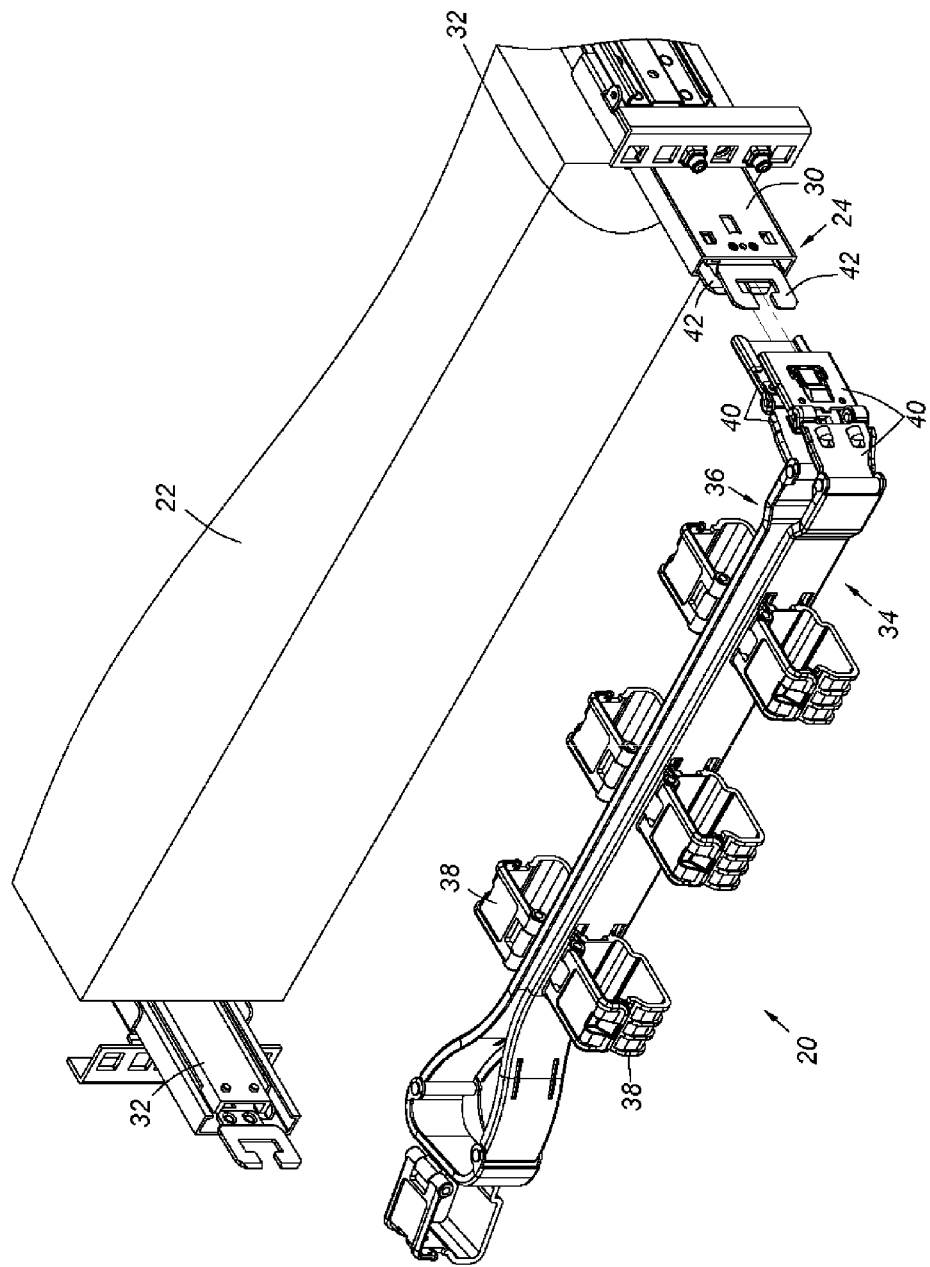
FIG. 2 is a diagram showing the cable management assembly of FIG. 1 correspondingly connected to rails of a slide rail assembly.

As shown in FIG. 2, the slide rail assembly 24 comprises a first rail 30 and a second rail 32 movable longitudinally relative to the first rail 30. The carried object 22 is configured to mount on the second rail 32. The cable management assembly 20 comprises a first cable management arm 34, a second cable management arm 36 and a plurality of cable management devices 38. The first cable management arm 34 and the second cable management arm 36 can be connected to second connection components 42 of the first rail 30 and the second rail 32 through first connection components 40 respectively. In another embodiment of the present invention, the second cable management arm 36 also can be correspondingly connected to one part of the carried object 22 through the first connection component 40, but the present invention is not limited thereto. The cable management devices 38 can be arranged on the first cable management arm 34 and the second cable management arm 36.

Figure 3:
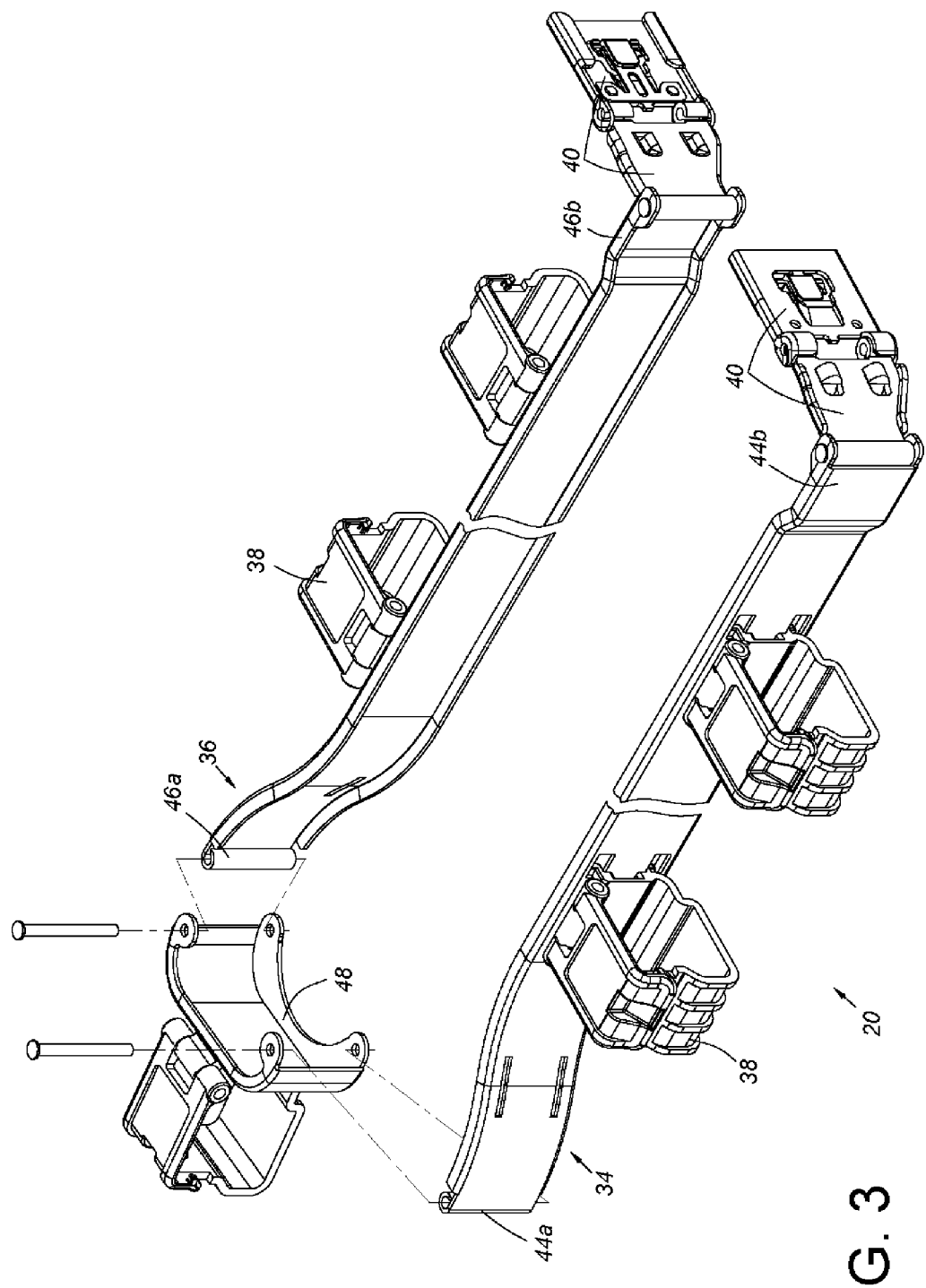
FIG. 3 is an exploded view of the cable management assembly according to an embodiment of the present invention.

As shown in FIG. 3, the first cable management arm 34 has a first end 44a and a second end 44b corresponding to the first end 44a. The second cable management arm 36 has a first end 46a and a second end 46b corresponding to the first end 46a. Wherein, the first end 44a of the first cable management arm 34 is movably connected to the first end 46a of the second cable management arm 36, for example, the first end 44a of the first cable management arm 34 and the first end 46a of the second cable management arm 36 can be pivoted together through a connection part 48. On the other hand, the aforementioned two first connection components 40 can be movably connected to the second end 44b of the first cable management arm 34 and the second end 46b of the second cable management arm 36 respectively.

Figure 4:
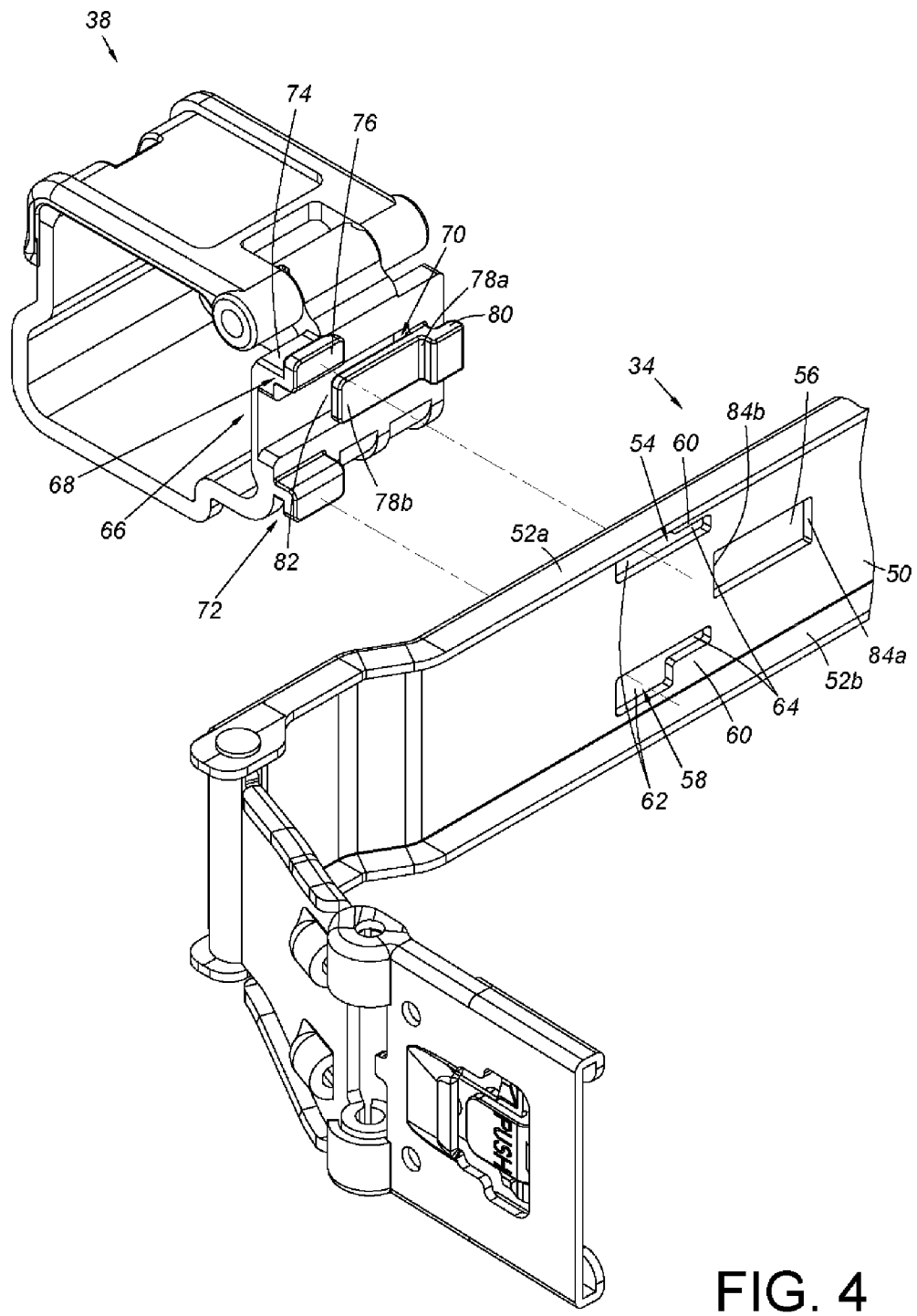
FIG. 4 is a diagram showing a cable management device of the cable management assembly detached from a cable management arm according to an embodiment of the present invention.

As shown in FIG. 4, the first cable management arm 34 (or the second cable management arm 36) can comprise an arm portion 50, and preferably further comprises an upper wall 52a and a lower wall 52b connected to two sides of the arm portion 50 respectively. The aforementioned first cable management arm 34 is an example comprising the arm portion 50, the upper wall 52a and the lower wall 52b, but the present invention is not limited thereto. The arm portion 50 of the first cable management arm 34 is arranged with a first mounting hole 54 and a positioning hole 56, and preferably further arranged with a second mounting hole 58. The first mounting hole 54 and the second mounting hole 58 are respectively arranged at two corresponding positions on the arm portion 50 adjacent to the upper wall 52a and the lower wall 52b of the first cable management arm 34, and the positioning hole 56 is arranged at a side adjacent to the first and second mounting holes 54, 58. Wherein, blocking sections 60 can be arranged near the first and second mounting holes 54, 58. The blocking section 60 can be a part of the arm portion 50, or the blocking section 60 can be a component arranged on the arm portion 50, the present invention is not limited thereto. Moreover, each of the first and second mounting holes 54, 58 can comprise a first hole portion 62 and a second hole portion 64. The second hole portion 64 is smaller (or narrower) than the first hole portion 62, and communicated with the first hole portion 62. The blocking section 60 can be arranged near the second hole portion 64.

The cable management device 38 can be detachably mounted to the first cable management arm 34. The cable management device 38 comprises a base 66, a first mounting portion 68 and an elastic portion 70, and preferably further comprises a second mounting portion 72. The first mounting portion 68 and the second mounting portion 72 respectively correspond to the first mounting hole 54 and the second mounting hole 58 of the arm portion 50 of the first cable management arm 34. On the other hand, the elastic portion 70 corresponds to the positioning hole 56 of the arm portion 50. Specifically, the first mounting portion 68 and the second mounting portion 72 are connected to the base 66, and each of the first mounting portion 68 and the second mounting portion 72 can comprise a first protruding section 74 and a second protruding section 76 substantially connected to the first protruding section 74 perpendicularly. The elastic portion 70 is arranged on the base 66. Preferably, the elastic portion 70 can be made of a flexible material and comprise a first section 78a and a second section 78b corresponding to the first section 78a. The first section 78a is connected to the base 66, and a clasp arm 80 is arranged adjacent to the first section 78a. In addition, a space 82 (or a notch) is defined on the base 66 of the cable management device 38, and the second section 78b of the elastic portion 70 corresponds to the space 82.

Figure 5:
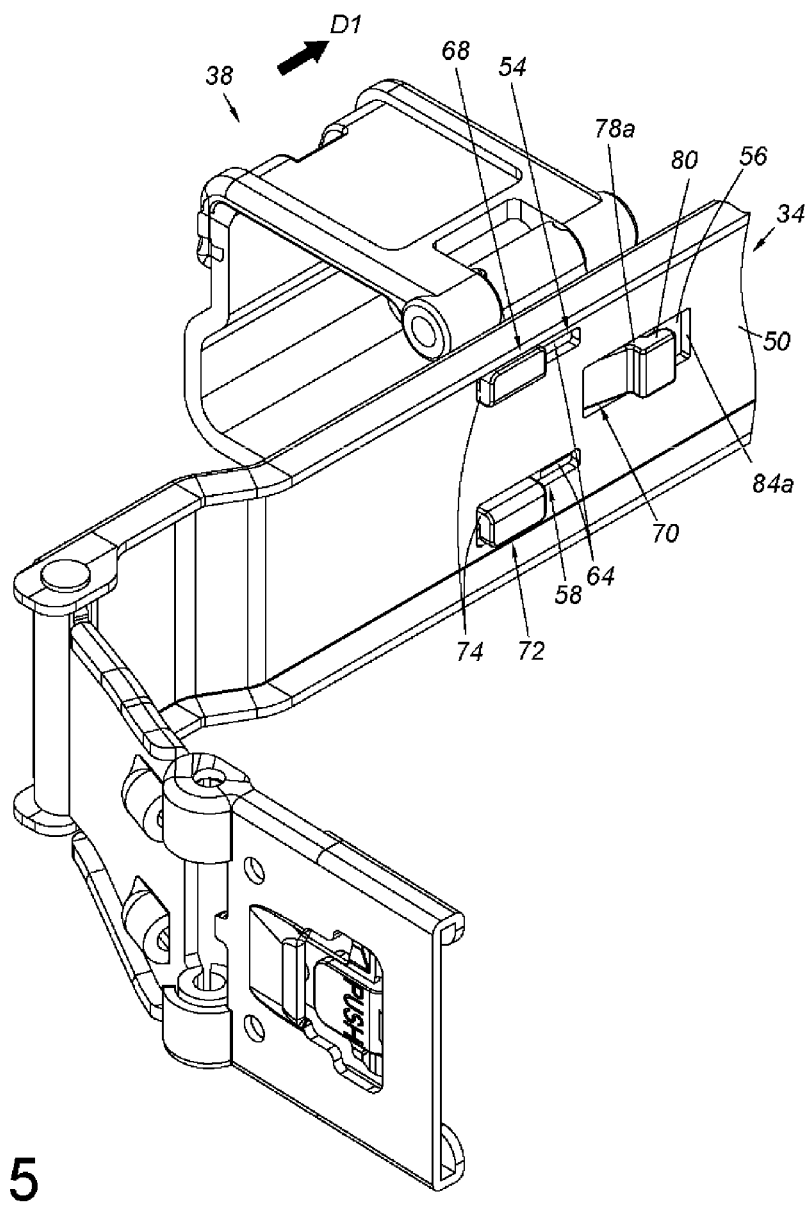
FIG. 5 is a diagram showing the cable management device of a cable management assembly while mounting to the cable management arm according to an embodiment of the present invention.

As shown in FIG. 4 and FIG. 5, during a mounting process, the first mounting portion 68 and the second mounting portion 72 of the cable management device 38 can be respectively aligned to the first mounting hole 54 and the second mounting hole 58 of the arm portion 50 of the first cable management arm 34, so that the first protruding sections 74 of the first mounting portion 68 and the second mounting portion 72 can enter the first mounting hole 54 and the second mounting hole 58 respectively. On the other hand, the first section 78a and the clasp arm 80 of the elastic portion 70 of the cable management device 38 are capable of entering the positioning hole 56 of the arm portion 50. When the first section 78a and the clasp arm 80 enter the positioning hole 56 of the arm portion 50, the second section 78b of the elastic portion 70 of the cable management device 38 is pressed by the arm portion 50, and the second section 78b temporarily enters the space 82 of the base 66 of the cable management device 38, so that the elastic portion 70 can accumulate an elastic force.

Figure 6:
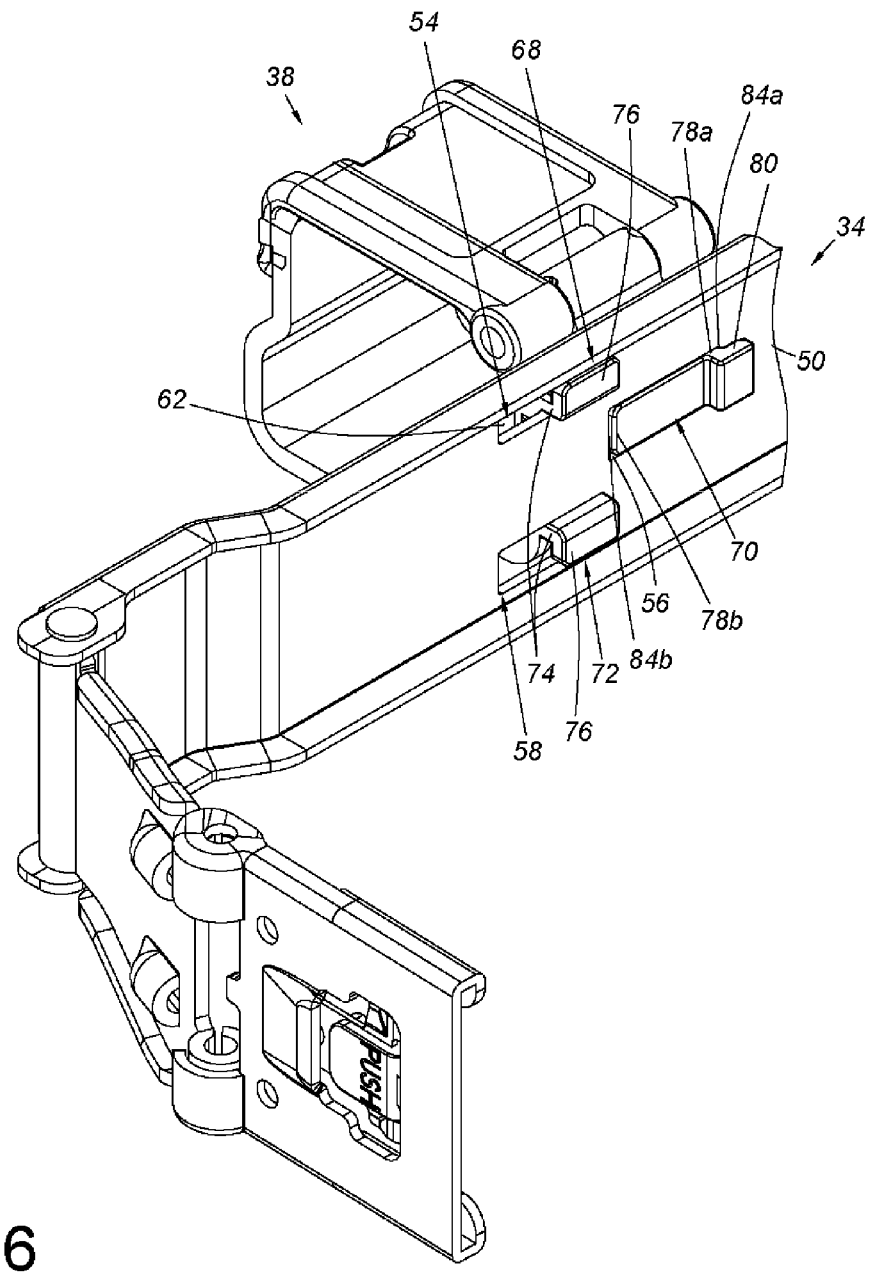
FIG. 6 is a diagram showing the cable management device of the cable management assembly after mounting to the cable management arm according to an embodiment of the present invention.
Figure 7:
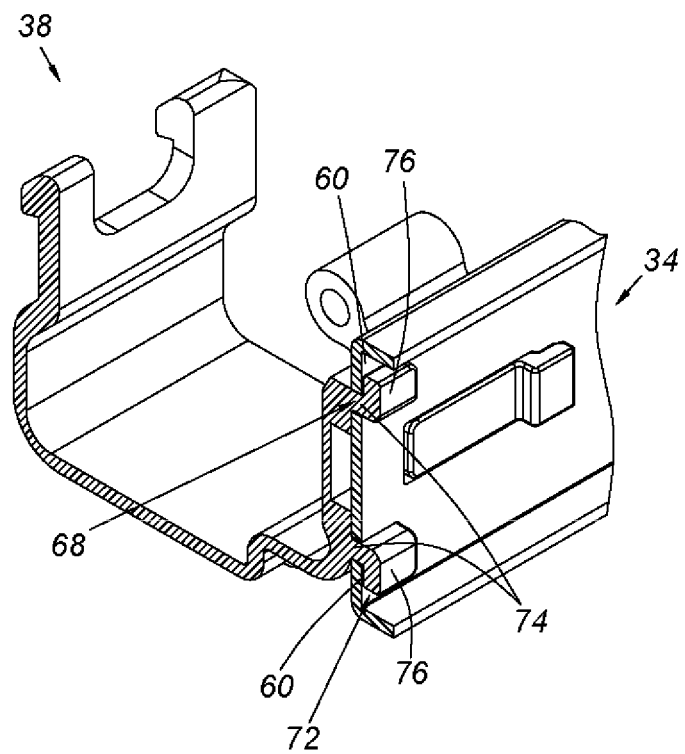
FIG. 7 is a diagram showing the cable management device combined with the cable management arm of the cable management assembly according to an embodiment of the present invention, for illustrating the mounting portion being blocked by a blocking section when the mounting portion of the cable management device enters the second hole portion of the mounting hole.

Please refer to FIG. 5 and FIG. 6. The cable management device 38 can be further moved toward a first direction D1. During this process, the first protruding sections 74 of the first mounting portion 68 and the second mounting portion 72 enter the second hole portions 64 from the first hole portions 62 of the first mounting hole 54 and the second mounting hole 58 respectively. Please also refer to FIG. 7. The second protruding sections 76 of the first mounting portion 68 and the second mounting portion 72 are blocked by corresponding blocking sections 60. On the other hand, the elastic portion 70 of the cable management device 38, such as the second section 78b of the elastic portion 70 releases the accumulated elastic force and enters the positioning hole 56 of the arm portion 50, and the elastic portion 70 is blocked by at least one blocking wall of the arm portion 50 of the first cable management arm 34. For example, the first section 78a and the second section 78b of the elastic portion 70 can be blocked by a first blocking wall 84a and a second blocking wall 84b of the arm portion 50 respectively. In addition, the clasp arm 80 arranged on the first section 78a of the elastic portion 70 can clasp with the arm portion 50 of the first cable management arm 34, in order to enhance reliability of mounting the cable management device 38 to the cable management arm. More particularly, because the first mounting hole 54 and the second mounting hole 58 are arranged at two corresponding positions on the arm portion 50 of the first cable management arm 34 (or the second cable management arm 36), when the first mounting portion 68 and the second mounting portion 72 are respectively mounted to the first mounting hole 54 and the second mounting hole 58, stability of mounting the cable management device 38 to the cable management arm is further enhanced.

Figure 8:
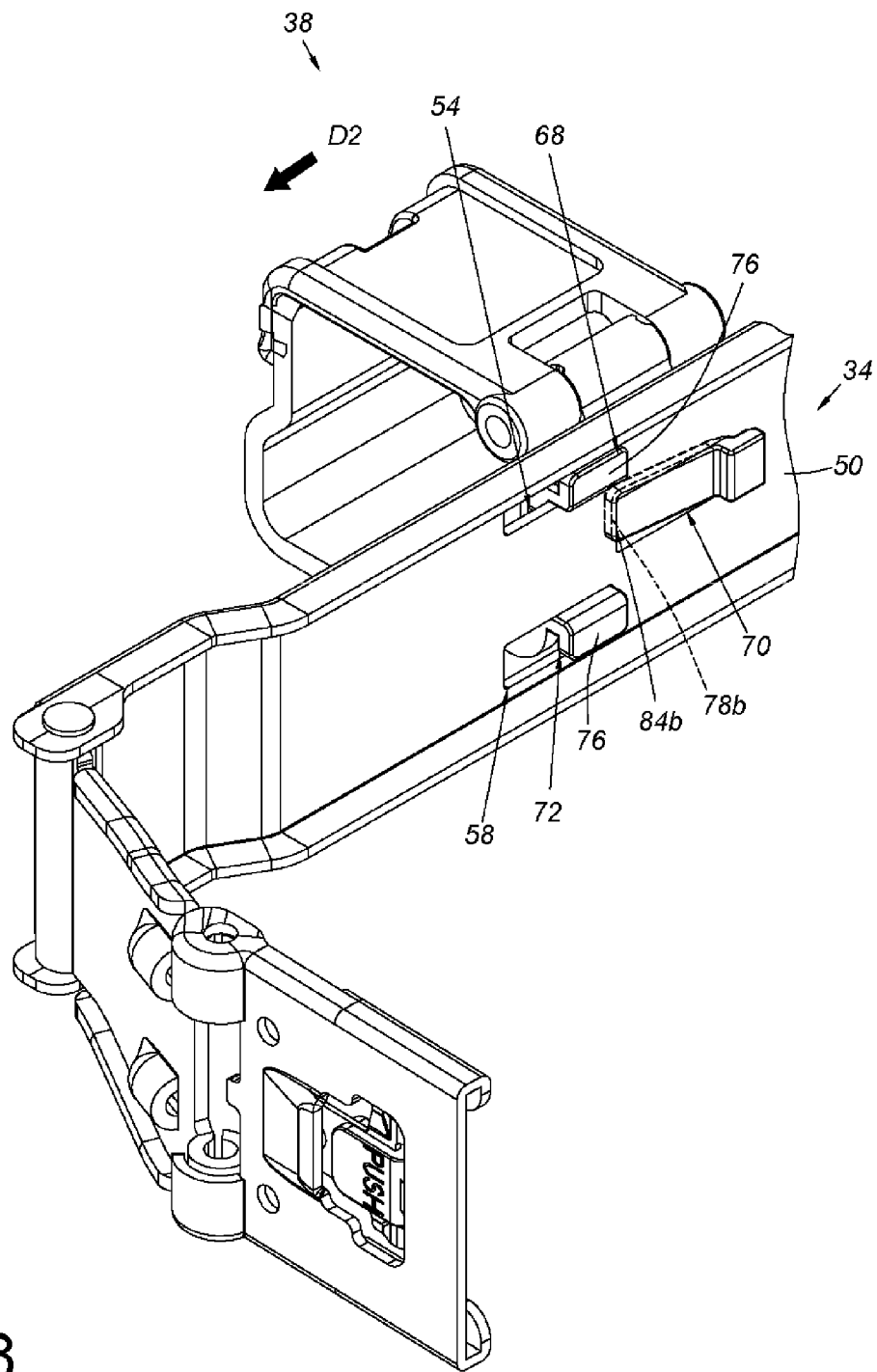
FIG. 8 is a diagram showing an operation of detaching of the cable management device from the cable management arm by operating an elastic portion of the cable management device of the cable management assembly according to an embodiment of the present invention.

As shown in FIG. 8, when detaching the cable management device 38 from the first cable management arm 34 (or the second cable management arm 36), the elastic portion 70 can be operated (for example, pressing one part of the second section 78b of the elastic portion 70) to avoid being blocked by the second blocking wall 84b of the arm portion 50 of the first cable management arm 34. Therefore, the cable management device 38 can be moved toward a second direction D2 opposite to the first direction D1, such that the second protruding sections 76 of the first mounting portion 68 and the second mounting portion 72 of the cable management device 38 is capable of moving apart from the blocking section 60 toward the second direction D2 and leave the second hole portion 64. Thus the first mounting portion 68 and the second mounting portion 72 can be detached from the first mounting hole 54 and the second mounting hole 58. Therefore, the cable management device 38 can be rapidly mounted to or detached from the cable management arm, so as to increase installation efficiency for operators.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management assembly, comprising:
   a first cable management arm arranged with a first mounting hole and a positioning hole, the first mounting hole comprising a first hole portion and a second hole portion; and
   a cable management device detachably mounted to the first cable management arm, the cable management device comprising a base, a first mounting portion and an elastic portion, the first mounting portion being connected to the base, and comprising a first protruding section and a second protruding section substantially connected to the first protruding section perpendicularly, the elastic portion being arranged on the base;
   wherein the first protruding section of the first mounting portion of the cable management device is capable of entering the second hole portion from the first hole portion of the first mounting hole of the first cable management arm, and the second protruding section of the first mounting portion is blocked by a first blocking section adjacent to the second hole portion, the elastic portion of the cable management device is configured to enter the positioning hole to be blocked by at least one blocking wall of the first cable management arm.

2. The cable management assembly of claim 1, wherein the first cable management arm is further arranged with a second mounting hole, the second mounting hole comprises a first hole portion and a second hole portion, the cable management device further comprises a second mounting portion, the second mounting portion is connected to the base and comprises a first protruding section and a second protruding section substantially connected to the first protruding section perpendicularly, the first protruding section of the second mounting portion is capable of entering the second hole portion from the first hole portion of the second mounting hole, and the second protruding section of the second mounting portion is blocked by a second blocking section.

3. The cable management assembly of claim 2, wherein the first mounting hole and the second mounting hole are arranged at two corresponding positions on the first cable management arm.

4. The cable management assembly of claim 1, wherein the elastic portion of the cable management device comprises a first section and a second section corresponding to the first section, the first section is connected to the base, a clasp arm is arranged on the first section for clasping with the first cable management arm.

5. The cable management assembly of claim 4, wherein a space is defined on the base of the cable management device, and the second section of the elastic portion corresponds to the space.

6. The cable management assembly of claim 1 further comprising a second cable management arm, a first end of the first cable management arm is pivoted to a first end of the second cable management arm through a connection part.

7. The cable management assembly of claim 6 further comprising two connection components respectively connected to a second end of the first cable management arm and a second end of the second cable management arm.

8. A cable management assembly, comprising:
   a cable management arm comprising an arm portion, the arm portion being arranged with a mounting hole and a positioning hole, the mounting hole comprising a first hole portion and a second hole portion smaller than the first hole portion; and
   a cable management device detachably mounted to the cable management arm, the cable management device comprising a base, a mounting portion and an elastic portion, the mounting portion being connected to the base and comprising a first protruding section and a second protruding section connected to the first protruding section, the elastic portion being arranged on the base;
   wherein, when the first protruding section of the mounting portion of the cable management device starts to enter the second hole portion from the first hole portion of the mounting hole of the cable management arm, the elastic portion of the cable management device accumulates an elastic force, and when the second protruding section of the mounting portion is blocked by a blocking section adjacent to the second hole portion, the elastic portion of the cable management device enters the positioning hole and release the elastic force, and the elastic portion is blocked by at least one blocking wall of the arm portion of the cable management arm.

9. The cable management assembly of claim 8, wherein when the elastic portion is operated to avoid being blocked by the at least one blocking wall of the arm portion of the cable management arm, the second protruding section of the mounting portion of the cable management device is capable of moving apart from the blocking section.

10. A cable management assembly, applicable to a carried object, the carried object being arranged on a pair of post of a rack through a slide rail assembly, the slide rail assembly comprising a first rail and a second rail longitudinally movable relative to the first rail, the carried object being configured to mount on the second rail, the cable management assembly comprising:
    a first cable management arm connected to the first rail of the slide rail assembly;
    a second cable management arm having a first end movably connected to the first cable management arm, and a second end connected to one of the second rail and the carried object, one of the first cable management arm and the second cable management arm comprising an arm portion, the arm portion being arranged with a mounting hole and a positioning hole, the mounting hole comprising a first hole portion and a second hole portion; and
    a cable management device detachably mounted to the arm portion, the cable management device comprising a base, a mounting portion and an elastic portion, the mounting portion being connected to the base and comprising a first protruding section and a second protruding section substantially connected to the first protruding section perpendicularly, the elastic portion being arranged on the base;
    wherein the first protruding section of the mounting portion of the cable management device is capable of entering the second hole portion from the first hole portion of the mounting hole, and the second protruding section of the mounting portion is blocked by a blocking section adjacent to the second hole portion, the elastic portion of the cable management device is configured to enter the positioning hole to be blocked by at least one blocking wall of the arm portion.

* * * * *